United States Patent
Sbiaa et al.

(10) Patent No.: US 7,495,867 B2
(45) Date of Patent: Feb. 24, 2009

(54) COMPOSITE FREE LAYER FOR STABILIZING MAGNETORESISTIVE HEAD

(75) Inventors: Rachid Sbiaa, Tokyo (JP); Isamu Sato, Tokyo (JP)

(73) Assignee: TDK Corporation, Tokyo (JP)

( * ) Notice: Subject to any disclaimer, the term of this patent is extended or adjusted under 35 U.S.C. 154(b) by 445 days.

(21) Appl. No.: 10/572,072

(22) PCT Filed: Apr. 4, 2004

(86) PCT No.: PCT/JP2004/004862

§ 371 (c)(1),
(2), (4) Date: Mar. 15, 2006

(87) PCT Pub. No.: WO2005/101378

PCT Pub. Date: Oct. 27, 2005

(65) Prior Publication Data

US 2007/0002503 A1      Jan. 4, 2007

(51) Int. Cl.
G11B 5/39 (2006.01)
(52) U.S. Cl. .................................. 360/324.11
(58) Field of Classification Search ............. 360/324.11
See application file for complete search history.

(56) References Cited

U.S. PATENT DOCUMENTS

| | | | |
|---|---|---|---|
| 5,738,938 A * | 4/1998 | Kawano et al. | 428/332 |
| 5,798,896 A | 8/1998 | Araki et al. | |
| 6,348,274 B1 * | 2/2002 | Kamiguchi et al. | 428/811 |
| 6,519,121 B1 * | 2/2003 | Gill | 360/324.11 |
| 7,079,361 B2 * | 7/2006 | Sugita et al. | 360/324 |
| 2002/0048186 A1 | 4/2002 | Allenspach et al. | |
| 2003/0174446 A1 * | 9/2003 | Hasegawa | 360/319 |
| 2004/0047086 A1 * | 3/2004 | Wang et al. | 360/324.12 |

FOREIGN PATENT DOCUMENTS

JP           5-17838 A         1/1993

OTHER PUBLICATIONS

S. G. Reidy, et al., "Dopants for independent control of precessional frequency and damping in $Ni_{81}Fe_{19}$ (50 nm) thin films", Applied Physics Letters, pp. 1254-1256, vol. 82, No. 8.
M. Tsoi, et al., "Excitation of a Magnetic Multilayer by an Electric Current", Physical Review Letters, vol. 80, No. 19, pp. 4281-4284, May 11, 1998.
J.C. Slonczewski, "Excitation of spin waves by an electric current", Journal of Magnetism and Magnetic Materials 195 (1999) L261-L268.
J.A. Katine, et al., "Current-Driven Magnetization Reversal and Spin-Wave Excitations in Co/Cu/Co Pillars", Physical Review Letters, vol. 84, No. 14, pp. 3149-3152, Apr. 3, 2000.
M.R. Pufall, et al., "Materials dependence of the spin-momentum transfer efficiency and critical current in ferromagnetic metal/Cu multilayers", Applied Physics Letters, vol. 83, No. 2, pp. 323-325, Jul. 14, 2003.
Y. Zhou, et al., "Thermally excited ferromagnetic resonance as diagnostic tool for spin valve heads", Journal of Applied Physics, vol. 93, No. 10, May 15, 2003, pp. 8579-8581.

* cited by examiner

*Primary Examiner*—Mark Blouin
(74) *Attorney, Agent, or Firm*—Sughrue Mion, PLLC

(57) ABSTRACT

A magnetoresistive read head includes a spin valve having at least one free layer spaced apart from at least one pinned layer by a spacer. The free layer includes a cobalt compound as a thin film including at least one of Co—X, CoFe—X and CoNi—X, where X is an element from the lanthanoid family (a 4-f element). The content of Co is higher than 80 percent, and the content of the lanthanoid element is less than 10 percent. The film may comprise the entire free layer, or be positioned adjacent to one or more conventional free layer films. The pinned layer is a conventional single layer, or a synthetic multi-layered structure having a spacer between sub-layers. Because the spin valve structure has a high exchange stiffness and damping factor, spin transfer effect is reduced and a high-speed dynamic response is provided.

18 Claims, 11 Drawing Sheets

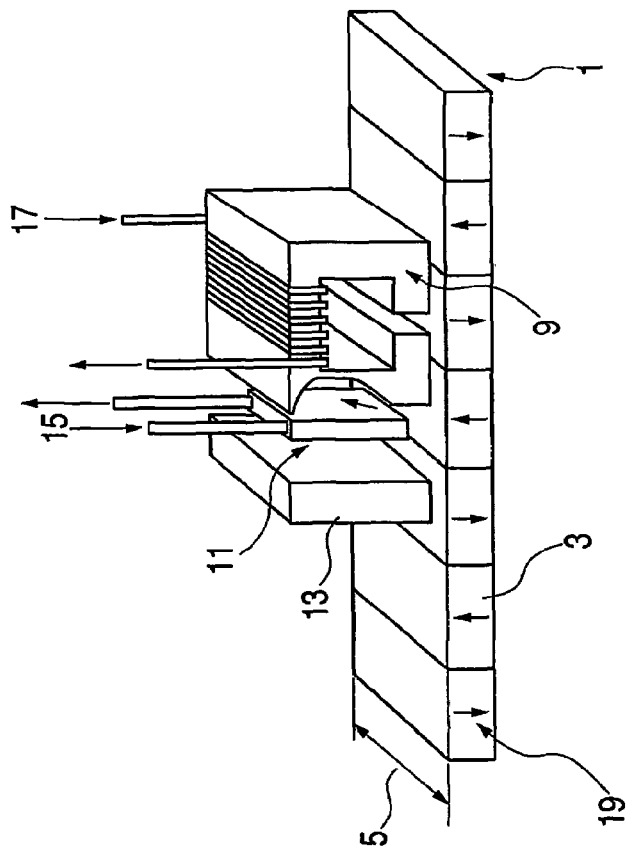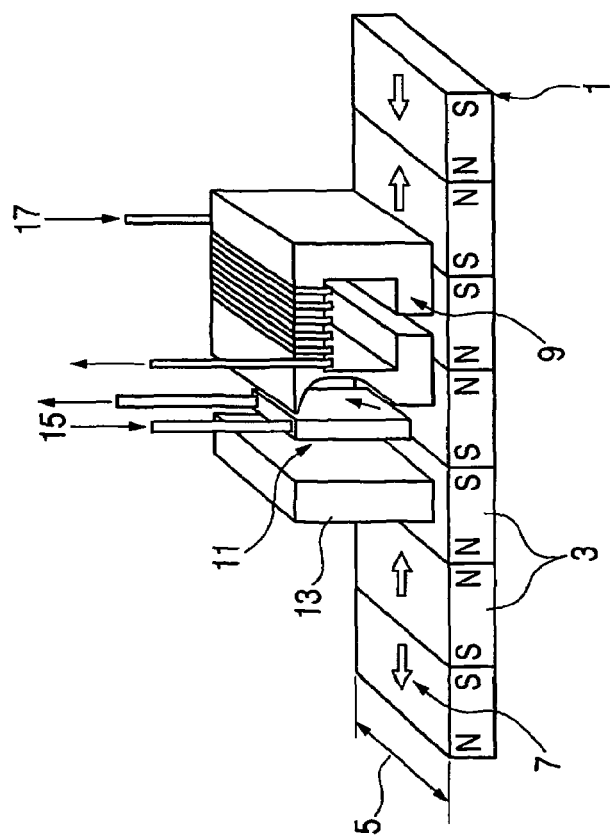

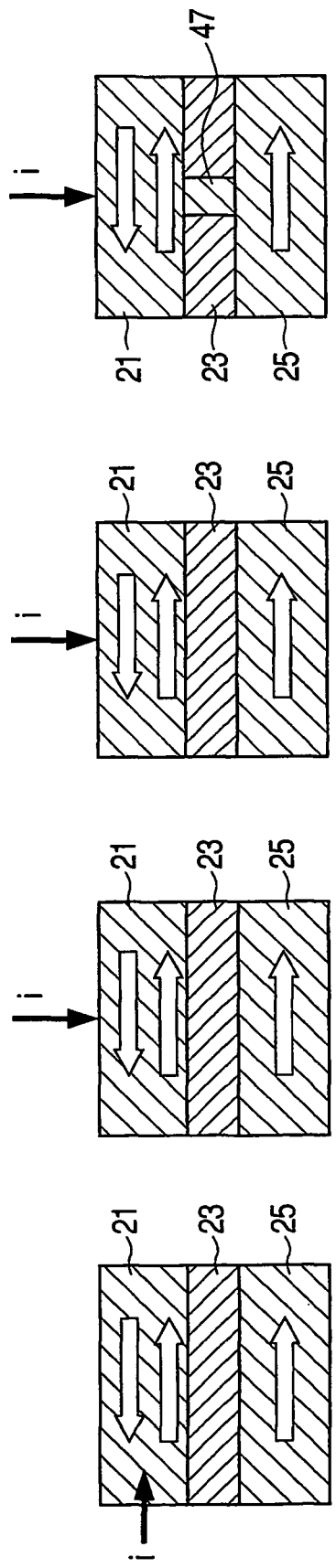

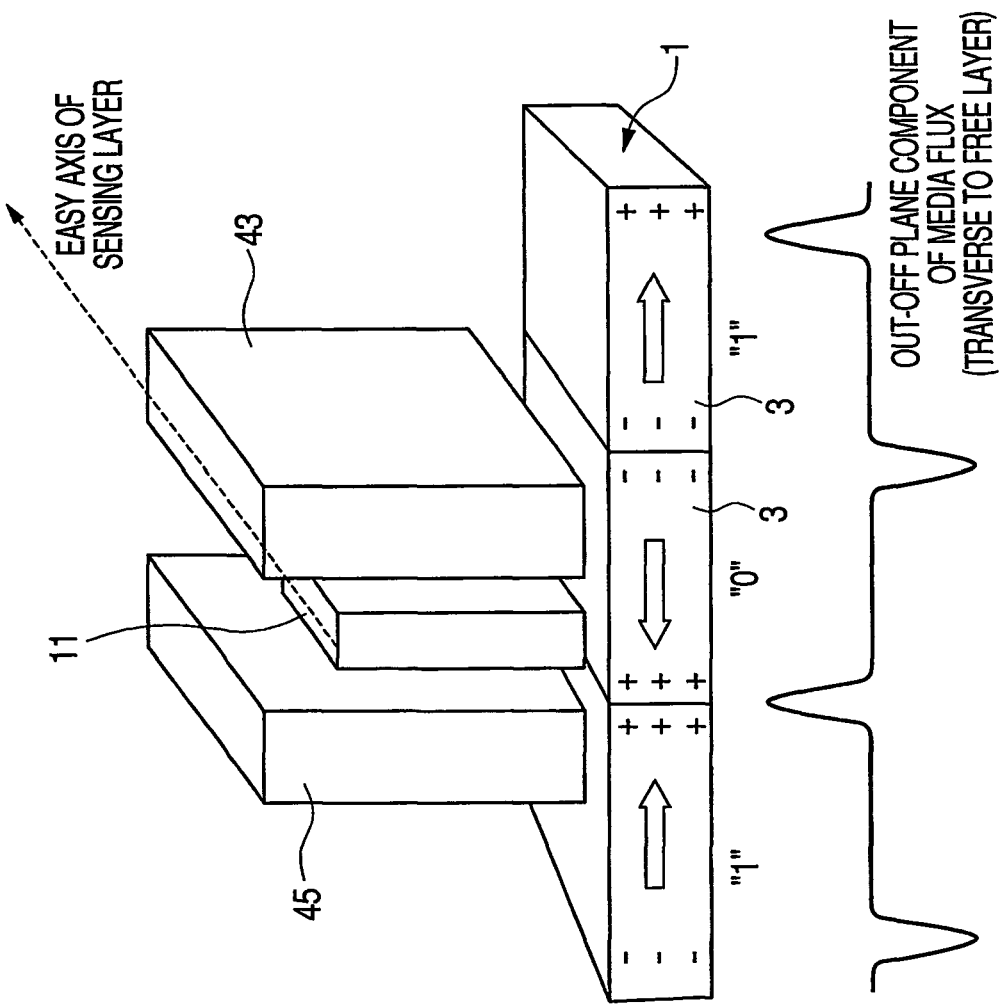

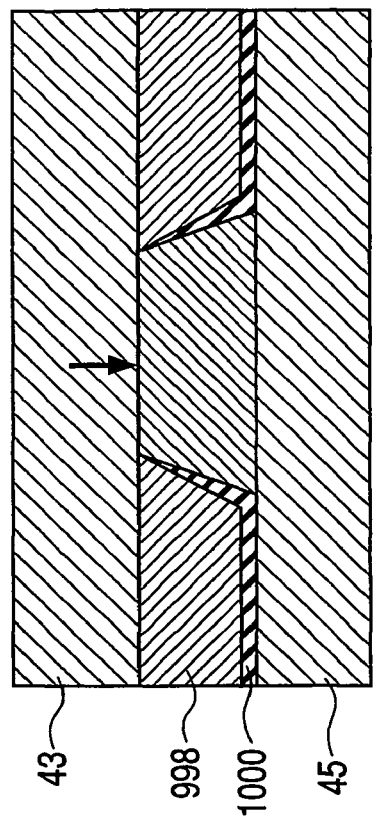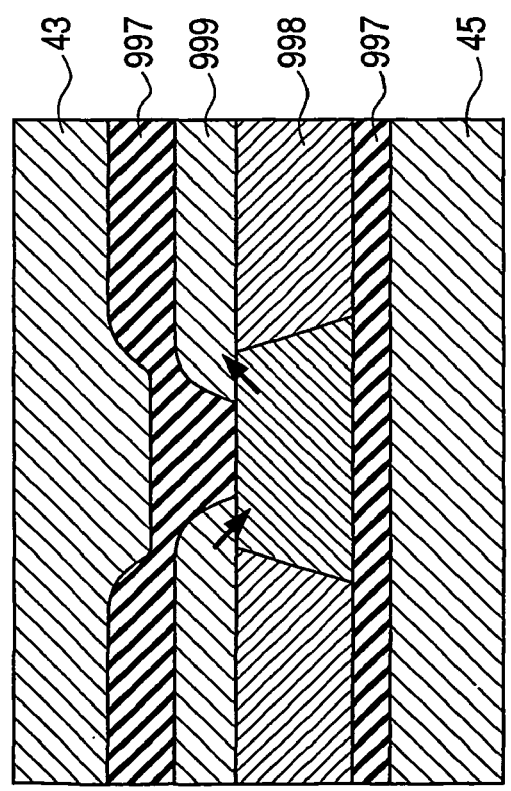
FIG. 7(b)
FIG. 7(a)

COMPOSITE FREE LAYER FOR STABILIZING MAGNETORESISTIVE HEAD

TECHNICAL FIELD

The present invention relates to the field of a read element of a magnetoresistive (MR) head. More specifically, the present invention relates to a spin valve of an MR read element having a free layer that includes a material having a high exchange stiffness and a high damping factor.

BACKGROUND ART

In the related art magnetic recording technology such as hard disk drives, a head is equipped with a reader and a writer. The reader and writer have separate functions and operate independently of one another, with no interaction therebetween.

FIGS. 1(a) and (b) illustrate related art magnetic recording schemes. A recording medium 1 having a plurality of bits 3 and a track width 5 has a magnetization parallel to the plane of the recording media. As a result, a magnetic flux is generated at the boundaries between the bits 3. This is also commonly referred to as "longitudinal magnetic recording".

Information is written to the recording medium 1 by an inductive write element 9, and data is read from the recording medium 1 by a read element 11. A write current 17 is supplied to the inductive write element 9, and a read current is supplied to the read element 11.

The read element 11 is a sensor that operates by sensing the resistance change as the sensor magnetization direction change from one direction to the other. A shield 13 is also provided to reduce the undesirable magnetic fields coming from the media and prevent the undesired flux of adjacent bits from interfering with the one of the bits 3 that is currently being read by the read element 11.

In the foregoing related art scheme, the area density of the recording medium 1 has increased substantially over the past few years, and is expected to continue to increase substantially over the next few years. Correspondingly, the bit density and track density is expected to increase. As a result, the related art reader must be able to read this data having increased density at a higher efficiency and speed.

Due to these requirements, another related art magnetic recording scheme has been developed, as shown in FIG. 1(b). In this related art scheme, the direction of magnetization 19 of the recording medium 1 is perpendicular to the plane of the recording medium. This is also known as "perpendicular magnetic recording". This design provides more compact and stable recorded data.

FIGS. 2(a)-(c) illustrate various related art read elements for the above-described magnetic recording scheme, known as "spin valves". In the bottom type spin valve illustrated in FIG. 2(a), a free layer 21 operates as a sensor to read the recorded data from the recording medium 1. A spacer 23 is positioned between the free layer 21 and a pinned layer 25. On the other side of the pinned layer 25, there is an anti-ferromagnetic (AFM) layer 27.

In the top type spin valve illustrated in FIG. 2(b), the position of the layers is reversed. The operation of the related art spin valves illustrated in FIGS. 2(a)-(b) is substantially similar, and is described in greater detail below.

The direction of magnetization in the pinned layer 25 is fixed, whereas the direction of magnetization in the free layer 21 can be changed, for example (but not by way of limitation) depending on the effect of an external field, such as the recording medium 1.

When the external field (flux) is applied to a reader, the magnetization of the free layer 21 is altered, or rotated, by an angle. When the flux is positive the magnetization of the free layer is rotated upward, and when the flux is negative the magnetization of the free layer is rotated downward. Further, if the applied external field changes the free layer 21 magnetization direction to be aligned in the same way than pinned layer 25, then the resistance between the layers is low, and electrons can more easily migrate between those layers 21, 25.

However, when the free layer 21 has a magnetization direction opposite to that of the pinned layer 25, the resistance between the layers is high. This is because it is more difficult for electrons to migrate between the layers 21, 25.

Similar to the external field, the AFM layer 27 provides an exchange coupling and keeps the magnetization of pinned layer 25 fixed. The properties of the AFM layer 27 are due to the nature of the materials therein. In the related art, the AFM layer 27 is usually PtMn or IrMn The resistance change when the layers 21, 25 are parallel and anti-parallel called ΔR should be high to have a highly sensitive reader. As head size decreases, the sensitivity of the reader becomes increasingly important, especially when the magnitude of the media flux is decreased. Thus, there is a need for high resistance change ΔR between the layers 21, 25 of the related art spin valve.

A summary of the well-known concepts of the related art spin valves is provided herein. When a polarized electron meets a ferromagnetic film, the electron is harmed by the magnetic moments and scattered. The lost of electron energy is transferred to the magnetic moment, based on the law of conservation of energy. This transfer of energy is manifested as torque, which acts on the ferromagnetic film. As noted above, the magnetization of the free layer may be perturbed and even switch under certain conditions, such as high current density, low magnetization, thin magnetic film and other intrinsic parameters, including exchange stiffness, and damping factor.

In the above-described related art spin valve, when the magnetic film has a sufficiently small magnetization, the resistance of its magnetization to energy transfer (momentum transfer) is weak, and its magnetization direction can be changed. Further, when the exchange stiffness (exchange energy between a magnetic moment and its neighbor) is small, some moments will switch before others.

Additionally, the related art spin valves under go a spin transfer effect. The spin transfer effect is similar to an additional damping effect added to the intrinsic damping factor (precession). But spin transfer has a different behavior than the intrinsic precession.

For a CPP-GMR spin valve with a current flowing through the film thickness, the pinned layer acts as a polarizing layer (source of polarization) because its magnetization does not change due to the flux of the recording media. However, the free layer is strongly affected by electron spin transfer, which exerts a torque on its magnetization. Spin transfer torque is calculated as follows:

$$\text{Spin transfer torque} = \tau^{-1}[M\times(M\times P)], \quad (1)$$

where τ is time constant depends on the current density and film intrinsic properties, and P is electron polarization direction, which depends on the source of polarization magnetization direction, in this case the pinned layer. FIG. 2(c) illustrates a related art dual type spin valve. Layers 21 through 25 are substantially the same as described above with respect to FIGS. 2(a)-(b). However, an additional spacer 29 is provided on the other side of the free layer 21, upon which a second pinned layer 31 and a second AFM layer 33 are positioned. The dual type spin valve operates according to the same principle as described above with respect to FIGS. 2(*a*)-(*b*). However, an extra signal provided by the second pinned layer 31 increases the resistance change ΔR.

FIG. 6 graphically shows the foregoing principle in the case of the related art longitudinal magnetic recording scheme as illustrated in FIG. 1(*a*). As the sensor moves across the recording media, the flux of the recording media at the boundary between bits, as shielded with respect to adjacent bits, provides the flux to the free layer, which acts according to the related art spin valve principles, which are described in greater detail below.

The operation of the related art spin valve is now described in greater detail. In the recording media 1, flux is generated based on polarity of adjacent bits. If two adjoining bits have negative polarity at their boundary, the flux will be negative. On the other hand, if both of the bits have positive polarity at the boundary, the flux will be positive. The magnitude of flux determines the angle of magnetization between the free layer and the pinned layer.

In addition to the foregoing related art spin valve in which the pinned layer is a single layer, FIG. 3 illustrates a related art synthetic spin valve. The free layer 21, the spacer 23 and the AFM layer 27 are substantially the same as described above. In this figure only one state of the free layer is illustrated. However, the pinned layer further includes a first sublayer 35 separated from a second sublayer 37 by a spacer 39.

In the related art synthetic spin valve, the first sublayer 35 operates according to the above-described principle with respect to the pinned layer 25. Additionally, the second sublayer 37 has an opposite spin state with respect to the first sublayer 35. As a result, the pinned layer total moment is reduced due to anti-ferromagnetic coupling between the first sublayer 35 and the second sublayer 37. A synthetic spin valve head has a pinned layer with a total magnetic flux close to zero and thus greater stability and high pinning field can be achieved.

FIG. 4 illustrates the related art synthetic spin valve with a shielding structure. As noted above, it is important to avoid unintended magnetic flux from adjacent bits from being sensed during the reading of a given bit. A protective layer 41 is provided on an upper surface of the free layer 21 to protect the spin valve against oxidation before deposition of top shield 43, which is usually done by electroplating in separated system. Similarly, a bottom shield 45 is provided on a lower surface of the AFM layer 27. A buffer layer, not shown in FIG. 4, is usually deposited before AFM layer 27 for a good spin-valve growth. The effect of the shield system is shown in FIG. 6, as discussed above.

As shown in FIGS. 5(*a*)-(*d*), there are four related art types of spin valves. The type of spin valve structurally varies based on the structure of the spacer 23.

The related art spin valve illustrated in FIG. 5(*a*) uses the spacer 23 as a conductor, and is used for the related art CIP scheme illustrated in FIG. 1(*a*), for a giant magnetoresistance (GMR) type spin valve. Because, the direction of sensing current magnetization, as represented by "i", is in the plane of the GMR element.

In the related art GMR spin valve, resistance is minimized when the magnetization directions (or spin states) of the free layer 21 and the pinned layer 25 are parallel, and is maximized when the magnetization directions are opposite. As noted above, the free layer 21 has a magnetization which direction can be changed. Thus, the GMR system avoids perturbation of the head output signal by minimizing the undesired switching of the pinned layer magnetization.

GMR depends on the degree of spin polarization of the pinned and free layers, and the angle between their magnetic moments. Spin polarization depends on the difference between the spin state (up or down) in each of the free and pinned layers. These concepts are discussed in greater detail below.

The GMR scheme will now be discussed in greater detail. As the free layer 21 receives the flux that signifies bit transition, the free layer magnetization rotates by a small angle in one direction or the other, depending on the direction of flux. The change in resistance between the pinned layer 25 and the free layer 21 is proportional to angle between the moments of the free layer 21 and the pinned layer 25. There is a relationship between resistance change and efficiency of the reader.

The GMR spin valve has various requirements. For example, but not by way of limitation, a large resistance change ΔR is required to generate a high output signal. Further, low coercivity is desired, so that small media fields can also be detected. With high pinning field strength, the AFM structure is well defined, and when the interlayer coupling is low, the sensing layer is not adversely affected by the pinned layer. Further, low magnetistriction is desired to minimize stress on the free layer.

However, the foregoing related art CIP-GMR has various disadvantages. One of them is that the electrode connected to the free layer must be reduced in size which will cause an overheat and damage of the head. Also the readout signal available from CIP-GMR is proportional to the MR head width, that means there is a limitation for CIP-GMR at high recording density.

To overcome the foregoing related art problem related art magnetic recording schemes are using CPP-GMR head, where the sensing current flows in the direction perpendicular to the spin valve plane. As a result, size can be reduced and thermal stability can be increased. Various related art spin valves that operate in the CPP scheme are illustrated in FIGS. 5(*b*)-(*d*), and are discussed in greater detail below.

FIG. 5(*b*) illustrates a related art tunneling magnetoresistive (TMR) spin valve for CPP scheme. In the TMR spin valve, the spacer 23 acts as an insulator, or tunnel barrier layer. Thus, the electrons can cross the insulating spacer 23 from free layer to pinned layer or verse versa. TMR spin valves have an increased MR on the order of about 30-50%.

FIG. 5(*c*) illustrates a related art CPP-GMR spin valve. While the general concept of GMR is similar to that described above with respect to CIP-GMR, the current is transferred perpendicular to the plane, instead of in-plane. As a result, the difference in resistance, as well as the intrinsic MR, are substantially higher than the CIP-GMR.

In the related art CPP-GMR spin valve, there is a need for a large resistance change ΔR, and a moderate element resistance for having a high frequency response. A low coercivity is also required so that a small media field can be detected. The pinning field should also have a high strength. Additional details of the CPP-GMR spin valve are discussed in greater detail below.

FIG. 5(*d*) illustrates the related art ballistic magnetoresistance (BMR) spin valve. In the spacer 23, which operates as an insulator, a ferromagnetic region 47 connects the pinned layer 25 to the free layer 21. The area of contact is on the order of a few nanometers. As a result, there is a substantially high MR, due to electrons scattering at the domain wall created within this nanocontact. Other factors include the spin polarization of the ferromagnets, and the structure of the domain that is in nano-contact with the BMR spin valve.

However, the related art BMR spin valve is in early development, and is not in commercial use. Further, there are related art problems with the BMR spin valve in that nano-contact shape and size controllability and stability of the domain wall must be further developed. Additionally, the repeatability of the BMR technology is yet to be shown for high reliability.

In the foregoing related art spin valves of FIGS. 5(a)-(d), the spacer 23 of the spin valve is an insulator for TMR, a conductor for GMR, and an insulator having a magnetic nano-sized connector for BMR. While related art TMR spacers are generally made of more insulating metals such as alumina, related art GMR spacers are generally made of more conductive metals, such as copper.

FIGS. 7(a)-(b) illustrate the structural difference between the CIP and CPP GMR spin valves. As shown in FIG. 7(a), there is a hard bias 998 on the sides of the GMR spin valve, with an electrode 999 on upper surfaces of the GMR. Gaps 997 are also required. As shown in FIG. 7(b), in the CPP-GMR spin valve, an insulator 1000 is deposited at the side of the spin valve that the sensing current can only flow in the film thickness direction. Further, no gap is needed in the CPP-GMR spin valve.

As a result, the current has a much larger surface through which to flow, and the shield also serves as an electrode. Hence, the overheating issue is substantially addressed.

Further, the spin polarization of the layers of the spin valve is intrinsically related to the electronic structure of the material, and a highly resistive material can induce an increase in the resistance change. Accordingly, there is an unmet need for a material having the necessary properties and thickness for operation in a CPP-GMR system.

Additional factors associated with the performance of the related art CPP-GMR system are provided below. Various related art studies have demonstrated the effect of electron spin polarized on magnetization switching, including M. Tsoi et al., Phys. Review Letters, 80, 4281 (1998), J. C. Slonczewski, J. Magnetism and Magnetic Materials, 195, L261 (1999), J. A. Katine et al., Phys. Review Letters, 84, 3149 (2000), M. R. Pufall et al., Applied Physics Letters, 83 (2), 323 (2003), the contents of which are incorporated herein by reference.

Spin transfer can occur by polarized electron which interact with the magnetization of the ferromagnetic (FM) layer. The electron becomes polarized when it travels across the pinned FM layer (source of polarization).

The following equation expresses the minimum current $I_{SW}$ required to switch the magnetization of the FM layer by spin transfer effect:

$$I_{sw} = \frac{et_F}{\hbar\varepsilon}\left[\frac{23.4M_S D}{2\hbar\gamma} + 6.3r^2\alpha M_S(H_{app} + H_{exch} - M_S)\right] \quad (2)$$

In equation (2), e is the charge of electron, $\hbar$ is Planck constant, $t_F$ is the free layer thickness, $M_S$ is the saturation magnetization of the free layer, r is the contact area, $\gamma$ is the gyromagnetic factor, D is the exchange stiffness, $\alpha$ is the damping factor, $H_{app}$ is the applied field, $H_{exc}$ is the effective interlayer coupling field.

To reduce the undesired effect of spin transfer on switching the free layer magnetization (in other words, to maximize $I_{SW}$), materials with high $M_S$, D, and $\alpha$ are required. Also, thicker films are more stable against spin transfer induced switching (instability).

Regarding the free layer saturation magnetization $M_S$, a small $M_S$ value is needed in the free layer, because the sensitivity of the head (output signal) is reduced as $M_S$ increases. More specifically, rotation of the free layer magnetization direction is more difficult for a large $M_S$ and easier for a small $M_S$.

The contact size r (assumed to be circular for simplicity) also affects $I_{SW}$. However, the head size is related to r and is thus continuously being reduced to achieve higher recording density.

In the related art studies, correlation between intrinsic properties and spin transfer switching has been determined. Also, dynamic response of magnetization switching has been studied. In conclusion, the ability of the head (sensor) to engage in fast switching of magnetization at a high frequency (e.g., GigaHertz) is important for high-speed reading of the recorded information (high data rate).

As recording media bit size is reduced, a thinner free layer is also needed. In the related art, there is a need for a free layer with a thickness of less than 3 nm for a sensor having a recording density of about 150 GB per square inch. In the future, it is believed that the need to reduce free layer thickness will continue. There is also a need to sense increasingly smaller bits at a very high frequency (i.e., high data rate) in recording head reader technology.

However, there are various problems and disadvantages in the related art. For example, but not by way of limitation, there is a problem of thermal stability, due to a high demagnetizing field. Further, there is a vortex effect, due to magnetic fluctuation, mainly at the edge.

Additionally, there is a spin transfer effect, due at least in part to transfer of electron momentum to the magnetic moment of the ferromagnetic thin film. If the current density is too high, the free layer magnetization will switch (i.e., the spin transfer occurs). As a result, there is a perturbation of the magnetic thin film magnetization, at least partially (in which case there is non-uniformity) or completely (in which case there is a complete switch of direction).

Accordingly, there is a related art need to minimize this spin transfer effect, such that the free layer magnetization is affected only by the media flux.

Also, perturbation or fluctuation of the magnetic moment distribution in the free layer (i.e., sensor) generates an additional source of noise. As a result, the signal noise ratio is reduced.

DISCLOSURE OF INVENTION

It is an object of the present invention to overcome at least the aforementioned problems and disadvantages of the related art. However, it is not necessary for the present invention to overcome those problems and disadvantages, nor any problems and disadvantages.

To achieve at least this object and other objects, a magnetic sensor for reading a recording medium and having a spin valve is provided, including a free layer having an adjustable spin state in response to a flux received from the recording medium and including a film comprising at least one of Co—X, CoFe—X and CoNi—X, where in X is a lanthanide (4f) element, as well as a pinned layer having a fixed flux. Also, a spacer sandwiched between the pinned layer and the free layer is provided, wherein the fixed flux of the pinned layer is stabilized in accordance with an antiferromagnetic (AFM) layer positioned on a surface of the pinned layer opposite the spacer.

In another exemplary, non-limiting embodiment, a magnetic sensor for reading a recording medium is provided, including a free layer having an adjustable spin state in response to a flux received from the recording medium. The free layer includes a first free sublayer comprising at least one of CoFe, NiFe and CoFeNi, and a second free sublayer comprising at least one of Co—X, CoFe—X and CoNi—X, wherein X is a lanthanide (4f) element. The magnetic sensor also includes a pinned layer having a fixed magnetization direction and a spacer sandwiched between the pinned layer and the free layer, wherein the magnetization direction of the pinned layer is pinned in accordance with an antiferromagnetic (AFM) layer positioned on a surface of the pinned layer opposite the spacer.

BRIEF DESCRIPTION OF DRAWINGS

The above and other objects and advantages of the present invention will become more apparent by describing in detail preferred exemplary embodiments thereof with reference to the accompanying drawings, wherein like reference numerals designate like or corresponding parts throughout the several views, and wherein:

FIGS. 1(a) and (b) illustrates a related art magnetic recording scheme having in-plane and perpendicular-to-plane magnetization, respectively;

FIGS. 5(a)-(d) illustrates various related art magnetic reader spin valve systems;

FIG. 6 illustrates the operation of a related art GMR sensor system;

FIGS. 7(a)-(b) illustrate related art CIP and CPP GMR systems, respectively;

MODES FOR CARRYING OUT THE INVENTION

Referring now to the accompanying drawings, description will be given of preferred embodiments of the invention.

In an exemplary, non-limiting embodiment of the present invention, a novel spin valve for a magnetoresistive head having a high resistivity material is provided, resulting in an improved spin valve.

The present invention is directed to parameters D and a of equation (2), which can be optimized based on material selection for the free layer. As a result of proper material selection, head stability is improved, and a high frequency response of the head (high data rate) is achieved.

More specifically, the present invention relates to material optimization for reducing spin transfer effect in a read head to increase the dynamic response of free layer and reduce the above-described vortex effect. Co thin film is used in the free layer due to its high exchange stiffness as compared to other related art materials used in heads (such as Fe, Ni, CoFe and $Ni_{80}Fe_{20}$). Co and $Co_{90}Fe_{10}$ have substantially the same exchange stiffness, which is significantly higher than that of Fe and $Ni_{80}Fe_{20}$. Table 1 shows the magnetic moment and exchange stiffness of the related material in head structure, as compared with that of the present invention.

TABLE 1

|  | $M_S$ (emu/cm$^3$) | A ($10^{-6}$ erg/cm) |
| --- | --- | --- |
| NiFe | 800 | ~1 |
| Fe | 1730 | ~2 |
| $Co_{90}Fe_{10}$ | 1460 | ~3 |
| Co | 1430 | ~3 |

As shown in TABLE 1, which shows $M_S$ and A for different magnetic materials, Co and $Co_xFe_{(1-x)}$ have higher exchange stiffness A than other materials such Fe, Ni or NiFe alloy. As a result, there is an increase in switching current due to spin transfer effect and a smaller vortex at the edge of the head, which results in a high stability against spin transfer perturbation. As noted in M. R. Pufall et al., Applied Physics Letters, 83 (2), 323 (2003), the contents of which is incorporated herein by reference, the high value of the product $M_S*D$ derived from equation (2) leads to a high $I_{SW}$.

Figure 10:
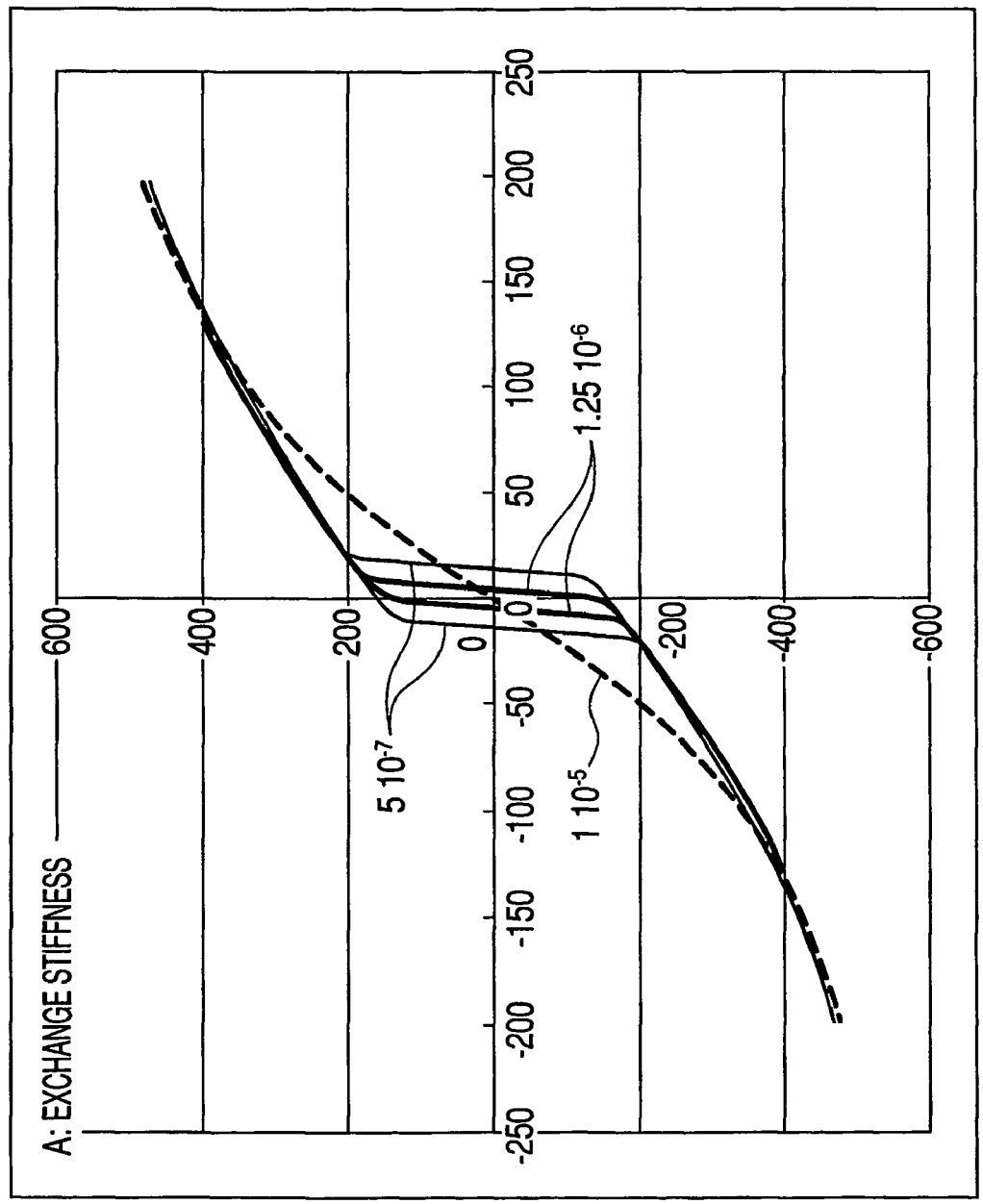
FIG. 10 illustrates exchange stiffness measurements for the free layer film according to the present invention as compared with related art film structures.

With respect to the smaller vortex at the head edge, as shown in the FIG. 10, low exchange stiffness energy D can lead to a vortex in the head edge that induces a hysteresis. In such a case, coercivity increases as exchange stiffness decreases.

A is related to D through as shown in equation (3):

$$A = \frac{M_s D}{2\gamma \hbar} \qquad (3)$$

As a result, D is proportional to A. As shown in Table 1 above, the cobalt thin films of the present invention have the best exchange stiffness. A lower value of A leads to generation of vortex in the sensor and consequently to noise. Thus, it is preferable to use materials with a higher exchange coupling, which results in less noise and a lower vortex.

Figure 11:
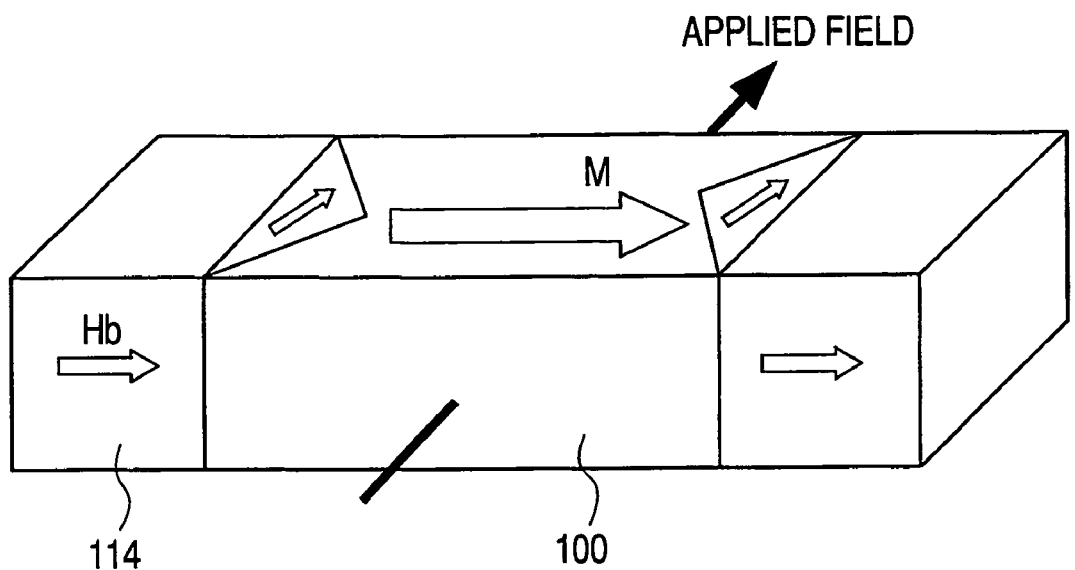
FIG. 11 generally illustrates applied fields in the sensor.

The foregoing result was obtained in a simulation based on the geometry shown in FIG. 11, with a bias field of 100 Oe and an external applied field in the direction of hard axis (similar to the media field direction). The output voltage is proportional to the angle between pinned layer and free layer. This simulation is for Permalloy with different exchange stiffness values.

Figure 12:
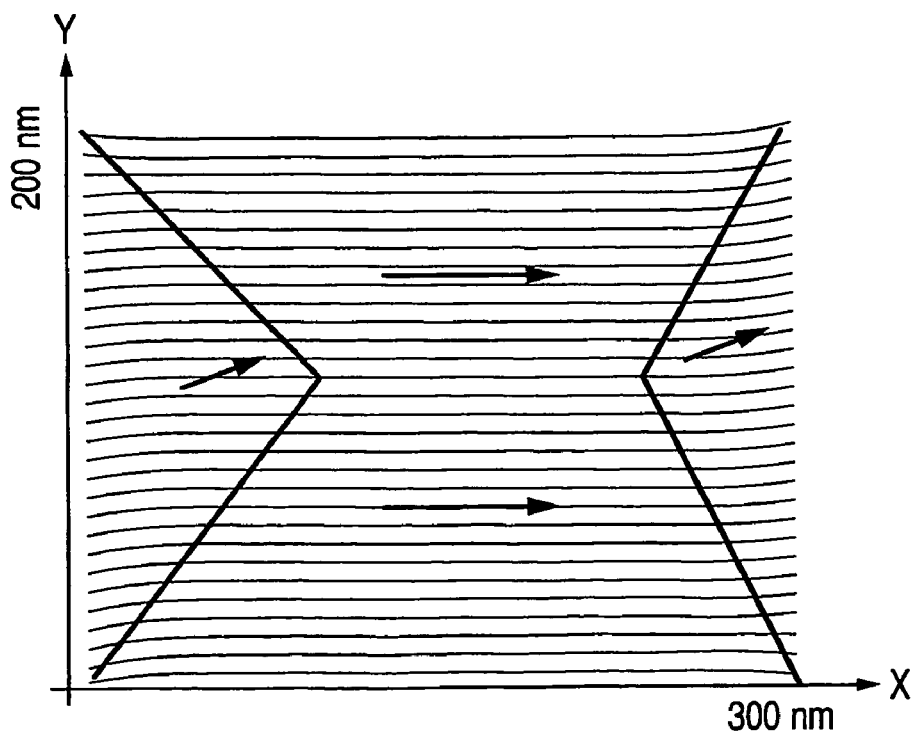
FIG. 12 generally illustrates a magnetic flux pattern for the structure illustrated in FIG. 11.

FIG. 12 illustrates the magnetic moment distribution in the free layer in the X-Y plane. The fluctuation of the magnetization is dominant at the edge of the film. As a result, noise generally increases during the read operation, and thus signal linearity is affected. The small arrows in FIG. 12 represent the magnetization distribution at different positions in the film plane, and the large arrows represent the averaging magnetization over a large area.

As shown in equation (2) above, in addition to D as discussed above, the parameter α also affects the switching current due to spin transfer. A high value of α is desirable for high frequency response for reading the information at high data rate.

There is a relationship between the material and the absorption coefficient. For example, amorphous rare earth-transition metals alloys are known to have a high absorption coefficient and also high damping parameter. Transition metals include Co, Fe and CoFe and rare earth include heavy rare earth such Gd, Tb, Dy, Ho. However, other metals such as Er, Tm were not investigated because of their low magnetic anisotropy when combined with transition metals such as Fe, Co, Ni and their alloys.

S. G. Reidy et al., Applied Physics Letters, 82 (8), 1254 (2003), demonstrated that the damping parameter α can be increased by a factor of four with only few percent of rare earth elements substituted to $Ni_{81}Fe_{19}$. In Reidy, only a small percent of rare earth metal is used to increase the parameter α. As a result, the magnetic properties of the free layer such as coercivity and spin polarization might be not degraded by the 4f-element (i.e., elements having their f electronic orbit incomplete).

Some rare earth metals such as Eu can increase the resonance frequency by 500 MHz. As a result, the noise in the head application due the resonance frequency (in the range of 3 to 4 GHz) may be shifted substantially. This is documented in Y. C. Zhou et al., J. APPL. PHYS. 93 (10): 8579-8581 Part 3 May 15 2003.

Accordingly, the present invention includes rich Co alloys and rare earth elements in a composed or laminated free layer. The free layer includes CoFe, NiFe as well as $Co_{(1-y)}$—$X_y$ and $[Co_zFe_{(1-z)}]_{(1-y)}$—$X_y$, where X is an element of the 4f group that includes La, Ce, Pr, Nd, Pm, Sm, Eu, Gd, Tb, Dy, Ho, Er, Tm and Yb. The composition y of 4f-element is below about 10%, at least in part because a higher amount of the 4f-element would affect the magnetic properties such as spin polarization, coercivity and magnetostriction.

Figure 2A:
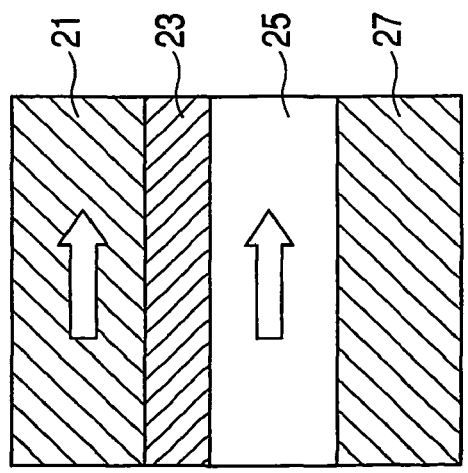
FIGS. 2(a)-(c) illustrate related art bottom, top and dual type spin valves.
Figure 2B:
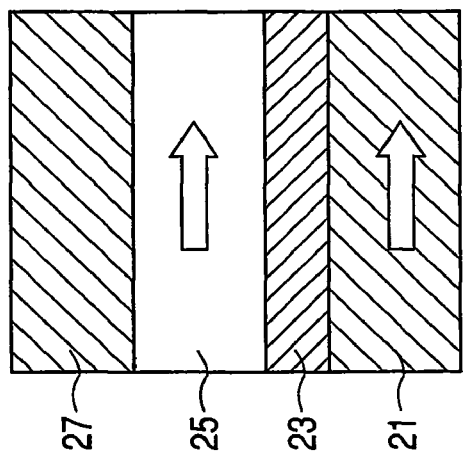
Figure 2C:
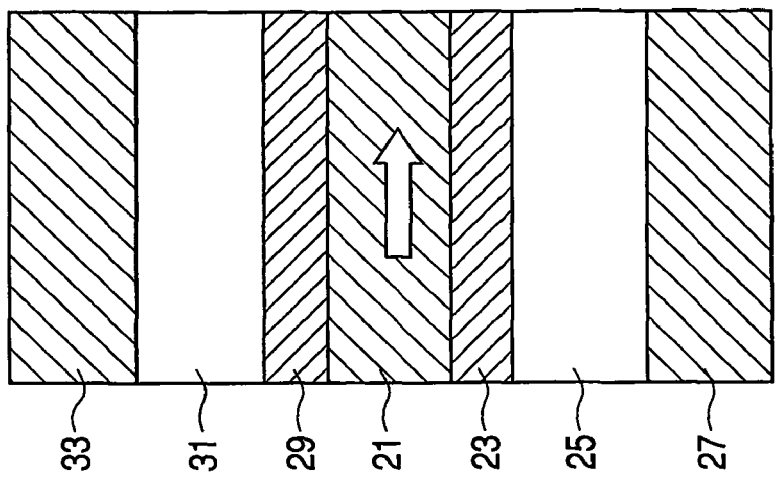
Figure 3:
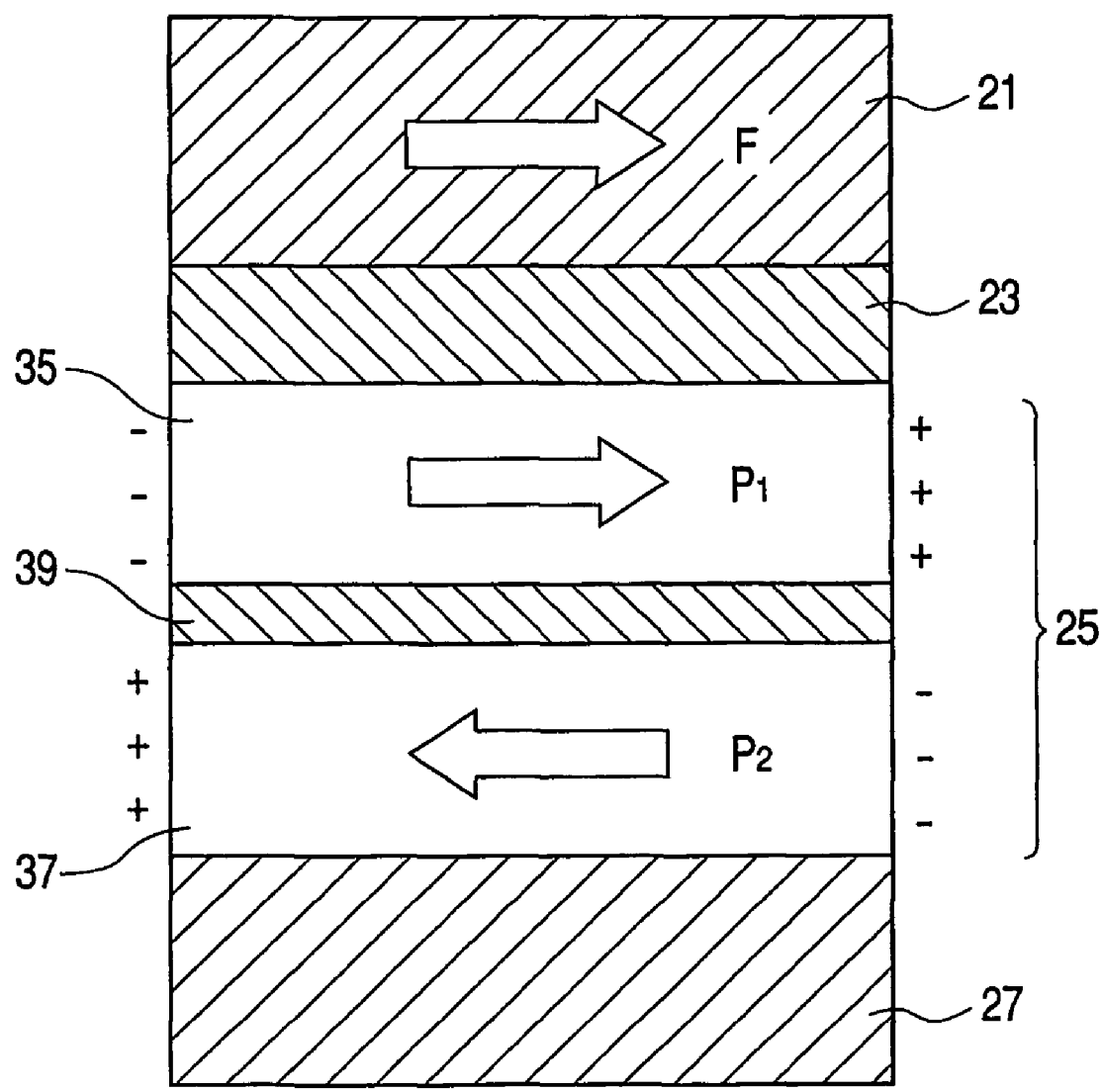
FIG. 3 illustrates a related art synthetic spin valve.
Figure 4:
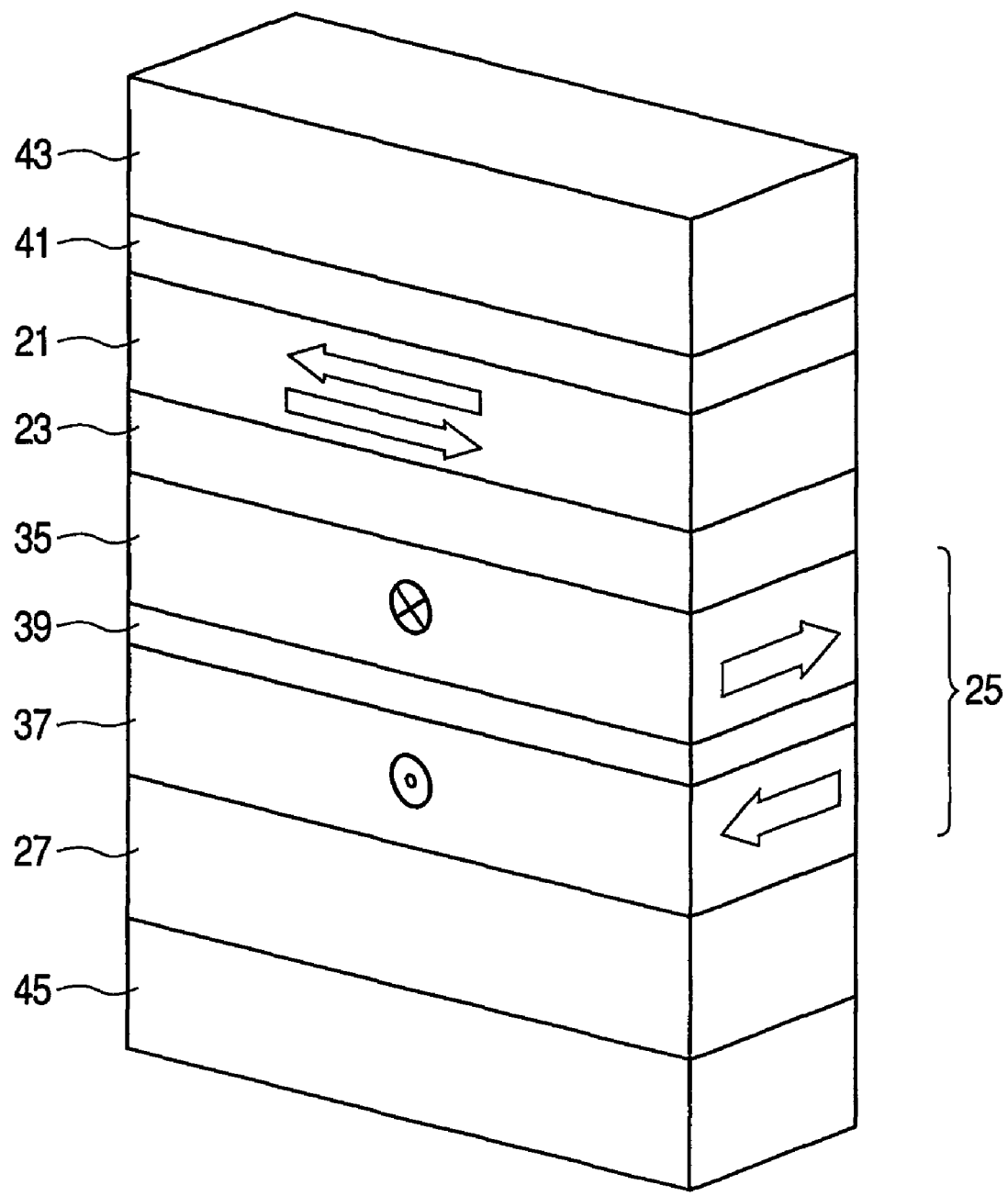
FIG. 4 illustrates a related art synthetic spin valve having a shielding structure.
Figure 8:
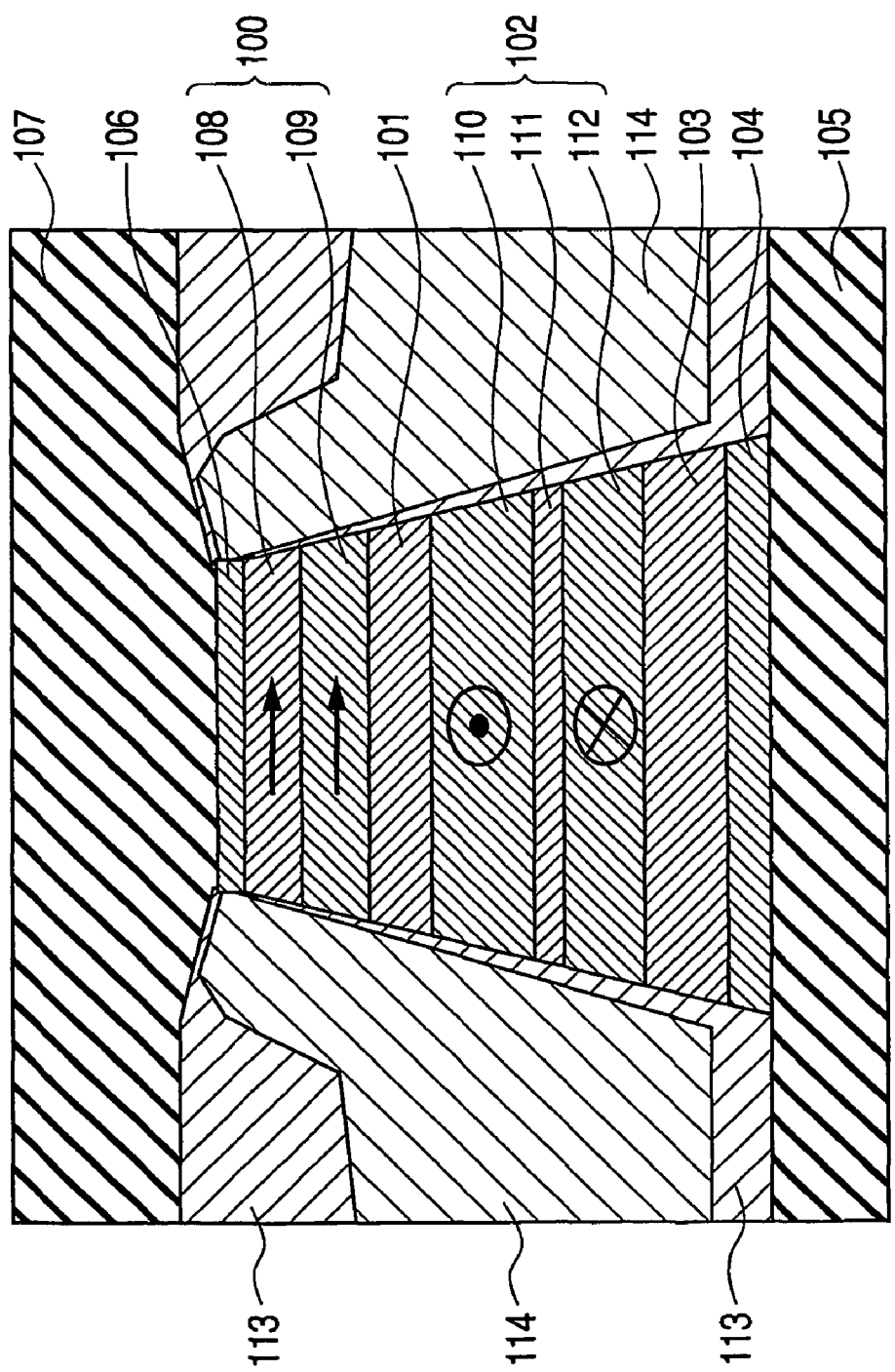
FIG. 8 illustrates a spin valve according to an exemplary, non-limiting embodiment of the present invention.

FIG. 8 illustrates a spin valve of a sensor for reading a magnetic medium according to an exemplary, non-limiting embodiment of the present invention. A free layer 100 is provided, and a first spacer 101 is positioned between the free layer 100 and a pinned layer 102. An AFM layer 103 is positioned on a lower surface of the pinned layer 102, and a buffer 104 is positioned on a lower surface of the AFM layer 103. A bottom shield 105 is provided below the buffer 104. Above the free layer 100, a capping layer 106 is provided and a top shield 107 is positioned on the capping layer 106.

On the sides of the sensor structure between the top shield 107 and the bottom shield 105, an insulator 113 is provided. A hard bias 114 is provided outside of the insulator 113, and another portion of the insulator 113 is provided between the hard bias 114 and the top shield 107.

The free layer 100 may include a first free sublayer 108 and a second free sublayer 109. Alternatively, the free layer 100 may be a single layer, made of a thin film that includes Co—X, CoFe—X and CoNi—X. As noted above, X represents an element of the 4f rare earth elements, also referred to as the "lanthanide" or "lanthanoid" series. In one exemplary, non-limiting embodiment of the present invention, X is of an amount that is less than about 10% of the free layer 100. The free layer 100 has a thickness between about 0.5 nm and 3 nm.

In another exemplary, non-limiting embodiment, the free layer 100 can be made of a lamination of CoFe—X and CoFe, or NiFe in multilayer structure, as shown in FIG. 8. The first free sublayer 108 can be selected from at least one of Co—X, CoFe—X and CoNi—X, and the second free sublayer 109 is selected from at least one of CoFe, NiFe and CoFeNi. In this embodiment, the total combined thickness of the free layer 100 is less than about 3 nm, the content of Co is higher than about 80%, and the content of X is less than about 10%, preferably about 3 to 5%.

While the free sublayers 108, 109 of the above-described embodiment are represented as shown above, the configuration is not limited thereto. For example, but not by way limitation the position of the first and second free sublayers 108, 109 may be reversed. Further, instead of being formed separately, the layers may be combined into a single, composite free layer 100 made from the materials indicated above as being in the sublayers 108, 109.

Figure 9:
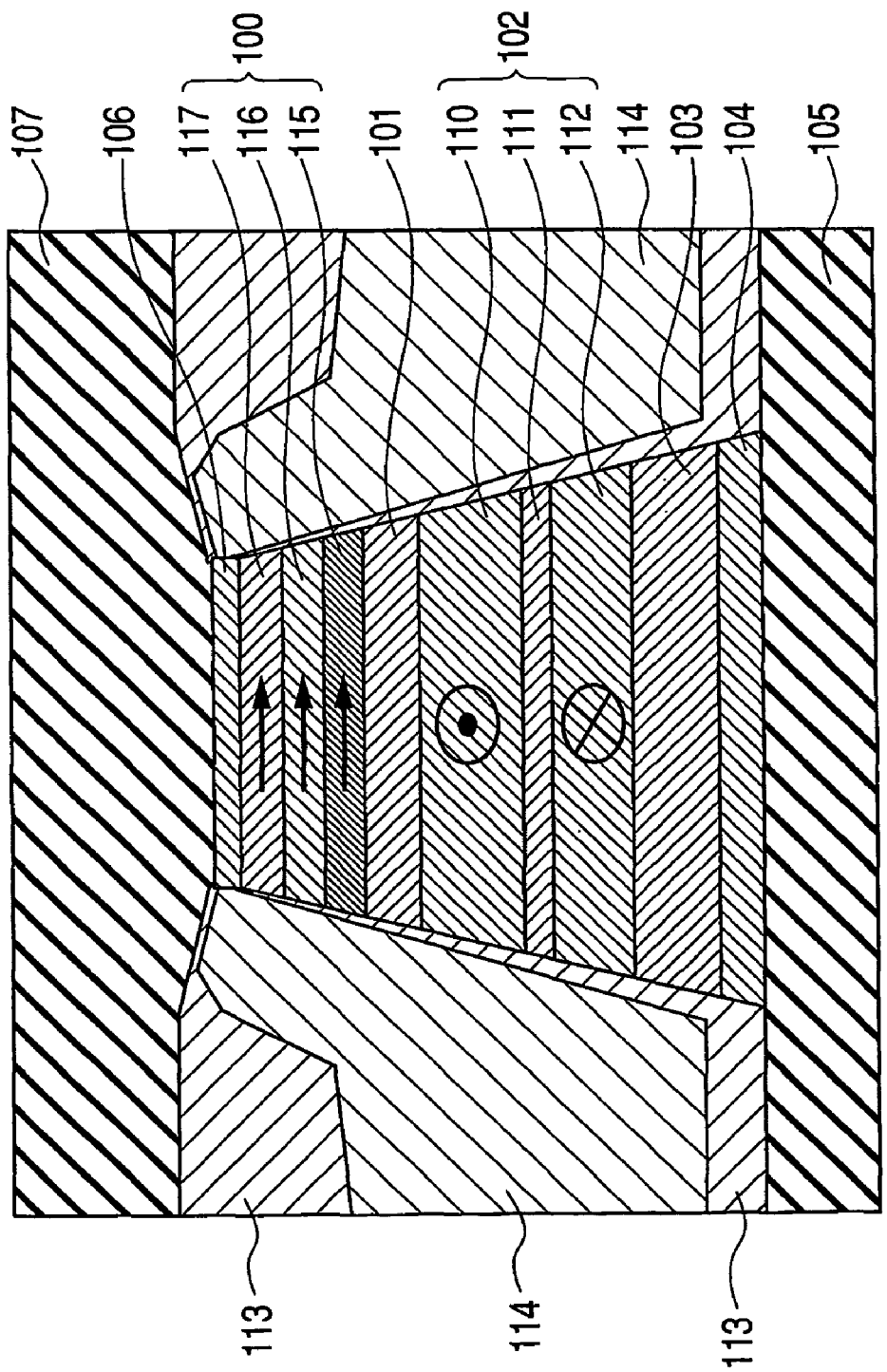
FIG. 9 illustrates a spin valve according to another exemplary, non-limiting embodiment of the present invention.

FIG. 9 shows another exemplary, non-limiting embodiment of the present invention. The free layer 100 has three sublayers 115, 116, 117. The first free layer 115 and the third free layer 117 are made of at least one of CoFe, NiFe and CoFeNi. The second free sublayer is sandwiched between the first and third free layers 115, 117, and is made of at least one of Co—X, CoFe—X and CoNi—X. The total thickness of the free layer in this embodiment is less than about 3 nm. With respect to the remaining features in FIG. 9, description of the like-numbered reference characters with respect to FIG. 8 is not repeated here.

For all of the foregoing exemplary, non-limiting embodiments of the present invention, additional variations may also be provided. For example, but not by way of limitation, in the pinned layer 102, a first pinned sublayer 112 is separated from a second pinned sublayer 110 by a second spacer 111. As an alternative to this synthetic structure, the pinned layer 102 may be made as a single layer.

Also, while FIGS. 8 and 9 illustrate a bottom type spin valve, the present invention is not limited thereto, and additional embodiments may be substituted therefor. For example, but not by way of limitation, the foregoing structure may also be a top or dual type spin valve, as would be understood by one skilled in the art.

Further, the spacer 101 is conductive when the spin valve is used in GMR applications, such as CPP- and CIP-GMR spin valves. For TMR applications, the spacer 101 is insulative. When a connecting is provided as discussed above with respect to the related art, a BMR-type head may be provided.

With respect to the stabilizing scheme that includes the insulator 113 and the hard bias 114, it is noted that the present invention is not limited to this scheme, and equivalents as would be understood by one skilled in the art are also contemplated. For example, but not by way of limitation, an in-stack bias may also be used, as is well known in the art.

The present invention has various advantages. For example, but not by way of limitation, the above-discussed Co—X and CoFe—X has at least the advantage of reducing the effect of spin transfer switching. As a result, there is less fluctuation of free layer magnetization and thus less noise.

Also, head dynamical switching at a high frequency is improved by increasing the damping factor α. More specifically, because of the addition of the 4f-element doped in ferromagnetic film, the reader has a high damping factor, which results in resistance to spin transfer magnetization switching or perturbation, as well as high frequency switching.

Further, due to the high exchange stiffness, there is resistance to spin transfer magnetization switching or perturbation. Also, there is less vortex creation and a high signal to noise ratio.

Further, any of the well-known compositions of those layers other than the free layer 100 and its various exemplary, non-limiting exemplary embodiments, may be used, including (but not limited to) those discussed above with respect to the related art. Further, because the compositions of those other layers is well-known to those skilled in the art, it is not repeated here in the detailed description of this invention, for the sake of brevity.

The present invention is not limited to the specific above-described embodiments. It is contemplated that numerous modifications may be made to the present invention without departing from the spirit and scope of the invention as defined in the following claims.

INDUSTRIAL APPLICABILITY

The present invention has various industrial applications. For example, it may be used in data storage devices having a magnetic recording medium, such as hard disk drives of computing devices, multimedia systems, portable communication devices, and the related peripherals. However, the present invention is not limited to these uses, and any other use as may be contemplated by one skilled in the art may also be used.

The invention claimed is:

1. A magnetic sensor having a spin valve, comprising:
a free layer having an adjustable magnetization direction in response to a magnetic flux and including a film comprising at least one of Co—X, CoFe—X and CoNi—X, wherein X is a lanthanide (4f) element;
a pinned layer having a fixed magnetization direction; and
a spacer sandwiched between said pinned layer and said free layer, wherein said magnetization direction of said pinned layer is fixed by an antiferromagnetic (AFM) layer positioned on a surface of said pinned layer opposite said spacer.

2. The magnetic sensor of claim 1, further comprising:
a buffer sandwiched between said AFM layer and a bottom shield that shields undesired flux at a first outer surface of said magnetic sensor;
a capping layer sandwiched between said free layer and a top shield that shields undesired flux at a second outer surface of said magnetic sensor; and
a stabilizer positioned on sides of said sensor laterally, and between said bottom shield and said top shield vertically.

3. The magnetic sensor of claim 2, wherein said stabilizer is one of (a) an in-stack bias and (b) a hard bias having insulators positioned between said hard bias, said top shield and said bottom shield.

4. The magnetic sensor of claim 1, wherein said lanthanide element comprises at least one of La, Ce, Pr, Nd, Pm, Sm, Eu, Gd, Tb, Dy, Ho, Er, Tm and Yb.

5. The magnetic sensor of claim 1, wherein said free layer has a thickness between about 0.5 nm and about 3.0 nm, and wherein said lanthanide has a concentration of less than about 10% in said free layer.

6. The magnetic sensor of claim 5, wherein said concentration of said lanthanide is between about 3% and about 5%.

7. The magnetic sensor of claim 1, wherein said spin valve is one of a top type, a bottom type, and a dual type, and said pinned layer is one of (a) single-layered and (b) multi-layered with a spacer between sublayers thereof.

8. The magnetic sensor of claim 1, wherein said spacer is one of:
(a) an insulator for use in a tunnel magnetoresistive (TMR) spin valve;
(b) a conductor for use in a giant magnetoresistive (GMR) spin valve; and
(c) an insulator with a magnetic nano-sized connected between said pinned layer and said free layer for use in a ballistic magnetoresistive (BMR) spin valve.

9. A magnetic sensor for reading a recording medium, comprising:
a free layer having an adjustable magnetization direction in response to a magnetic flux and including:
a first free sublayer comprising at least one of CoFe, NiFe and CoFeNi, and
a second free sublayer comprising at least one of Co—X, CoFe—X and CoNi—X, wherein X is a lanthanide (4f) element;
a pinned layer having a fixed magnetization direction; and
a spacer sandwiched between said pinned layer and said free layer, wherein said magnetization direction of said pinned layer is pinned in accordance with an antiferromagnetic (AFM) layer positioned on a surface of said pinned layer opposite said spacer.

10. The magnetic sensor of claim 9, wherein a content of Co comprises at least about 80% of said free layer, and a content of said X comprises less than about 10% of said free layer.

11. The magnetic sensor of claim 10, wherein said concentration of said lanthanide is between about 3% and about 5%.

12. The magnetic sensor of claim 9, wherein said first free sublayer is positioned one of: (a) adjacent to said spacer and said second free sublayer is positioned on an opposite surface of said first free sublayer from said spacer, and (b) adjacent to said spacer and said first free sublayer is positioned on an opposite surface of said second free sublayer from said spacer.

13. The magnetic sensor of claim 9, wherein said second free sublayer has a thickness between about 0.5 nm and about 3.0 nm.

14. The magnetic sensor of claim 9, further comprising:
a buffer sandwiched between said AFM layer and a bottom shield that shields undesired flux at a first outer surface of said magnetic sensor;
a capping layer sandwiched between said free layer and a top shield that shields undesired flux at a second outer surface of said magnetic sensor; and
a stabilizer positioned on sides of said sensor laterally, and between said bottom shield and said top shield vertically, wherein said stabilizer is one of (a) an in-stack bias and (b) a hard bias including insulators positioned between said hard bias, said top shield and said bottom shield.

15. The magnetic sensor of claim 9, wherein said lanthanide element comprises at least one of La, Ce, Pr, Nd, Pm, Sm, Eu, Gd, Tb, Dy, Ho, Er, Tm and Yb.

16. The magnetic sensor of claim 9, wherein said spin valve is one of a top type, a bottom type, and a dual type, and said pinned layer is one of single-layered and multi-layered with a spacer between sublayers thereof.

17. The magnetic sensor of claim 9, wherein said spacer is one of:
(a) an insulator for use in a tunnel magnetoresistive (TMR) spin valve;
(b) a conductor for use in a giant magnetoresistive (GMR) spin valve; and
(c) an insulator with a magnetic nano-sized connected between said pinned layer and said free layer for use in a ballistic magnetoresistive (BMR) spin valve.

18. The magnetic structure of claim 9, further comprising a third free sublayer comprising at least one of CoFe, NiFe and CoFeNi, wherein said second free sublayer is sandwiched between said first free sublayer and said third free sublayer.

* * * * *

UNITED STATES PATENT AND TRADEMARK OFFICE
CERTIFICATE OF CORRECTION

PATENT NO. : 7,495,867 B2
APPLICATION NO. : 10/572072
DATED : February 24, 2009
INVENTOR(S) : Rachid Sbiaa It is certified that error appears in the above-identified patent and that said Letters Patent is hereby corrected as shown below:

Title Page;

Please correct the PCT filing date on the front page as follows:

(22) PCT Filed: delete "April 4, 2004" and insert --April 2, 2004--

Signed and Sealed this

Twenty-fifth Day of August, 2009

David J. Kappos
*Director of the United States Patent and Trademark Office*